United States Patent
Stachowiak, Jr.

(10) Patent No.: US 7,176,376 B2
(45) Date of Patent: Feb. 13, 2007

(54) APPARATUS AND METHOD FOR SECURING A WATT-HOUR METER SOCKET BOX

(75) Inventor: John Stachowiak, Jr., Houston, TX (US)

(73) Assignee: DeWalch Technoloiges, Inc., Houston, TX (US)

( * ) Notice: Subject to any disclaimer, the term of this patent is extended or adjusted under 35 U.S.C. 154(b) by 73 days.

(21) Appl. No.: 10/823,285

(22) Filed: Apr. 13, 2004

(65) Prior Publication Data

US 2005/0224250 A1 Oct. 13, 2005

(51) Int. Cl.
*H02G 3/08* (2006.01)

(52) U.S. Cl. .................. 174/50; 174/481; 174/135; 174/58; 174/53; 361/604; 248/906

(58) Field of Classification Search ............. 174/50, 174/48, 53, 135, 58, 38; 220/4.02; 439/535; 248/906; 361/664, 668, 672
See application file for complete search history.

(56) References Cited

U.S. PATENT DOCUMENTS

| | | | | |
|---|---|---|---|---|
| 2,907,927 A | * | 10/1959 | Fisher | 361/659 |
| 3,753,047 A | * | 8/1973 | Shallbetter | 361/672 |
| 3,796,822 A | * | 3/1974 | Eickman | 174/48 |
| 4,615,113 A | * | 10/1986 | Fennel | 29/874 |
| 4,747,016 A | * | 5/1988 | Sloop, Sr. | 361/672 |
| 4,864,467 A | * | 9/1989 | Byrd et al. | 361/664 |
| 5,134,544 A | * | 7/1992 | Howell | 361/668 |
| 5,377,074 A | * | 12/1994 | Byrd | 361/664 |
| 5,663,525 A | * | 9/1997 | Newman | 174/50 |
| D463,248 S | | 9/2002 | Rafferty | |
| 6,742,365 B1 | | 6/2004 | Sullivan | |
| 6,763,691 B1 | | 7/2004 | Rafferty | |
| 6,800,806 B1 | * | 10/2004 | Grday | 174/50 |
| 6,825,413 B2 | * | 11/2004 | Jeon et al. | 174/50 |
| 6,828,502 B2 | * | 12/2004 | Green | 174/48 |
| 6,838,619 B1 | * | 1/2005 | Soyfertis | 174/50 |

\* cited by examiner

*Primary Examiner*—Dhiru R. Patel
(74) *Attorney, Agent, or Firm*—Arnold & Ferrera

(57) ABSTRACT

The present invention relates to an apparatus and method for securing a box cover to a watt-hour meter socket box. In certain embodiments, the apparatus has a clamping member that fits over a wall of a meter box, and a lock housing that locks to the clamping member after a box cover has been installed, thereby securing the cover to the box in a manner such that the box cover cannot be installed unless the clamping member has been installed correctly. In various other embodiments, the clamping member includes a clamp disposed between a clamp actuating member and a fastening shelf. In various other embodiments, the clamp includes a stopping member for indicating when the clamp actuating member is actuated into a fully secured position.

26 Claims, 5 Drawing Sheets

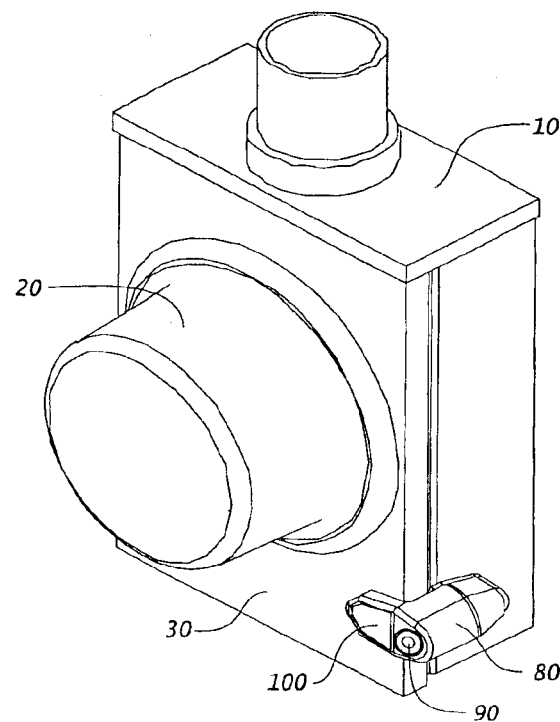
FIG. 3
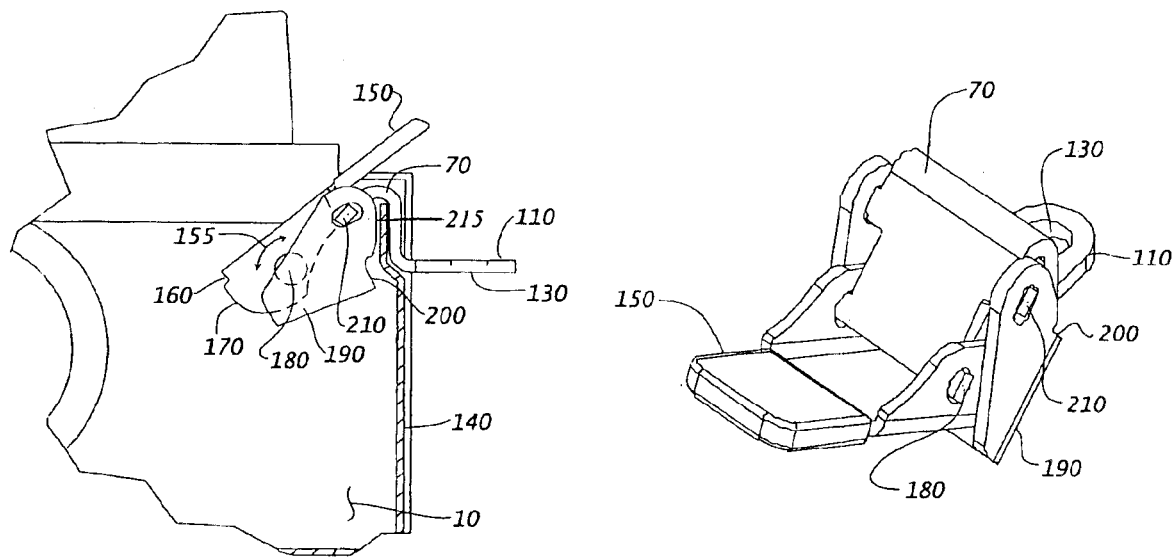
FIG. 4a
FIG. 4b

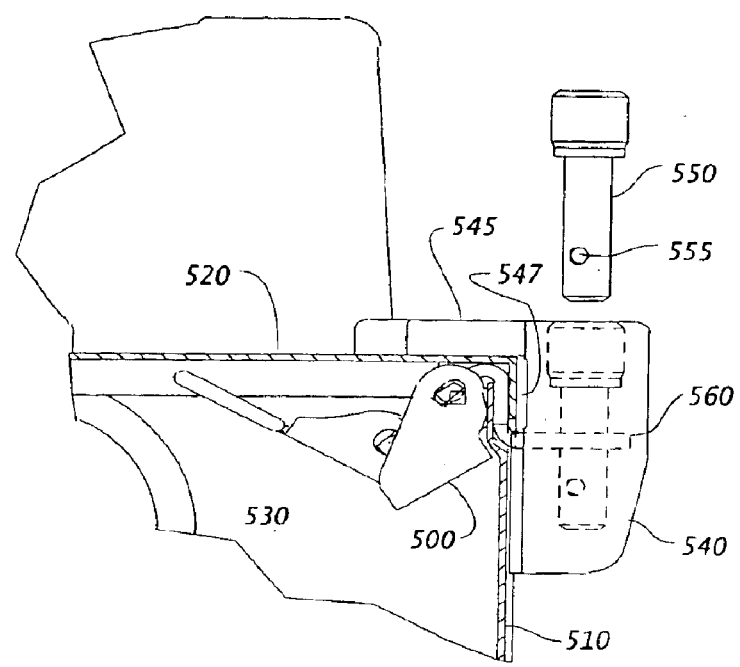
FIG. 7a
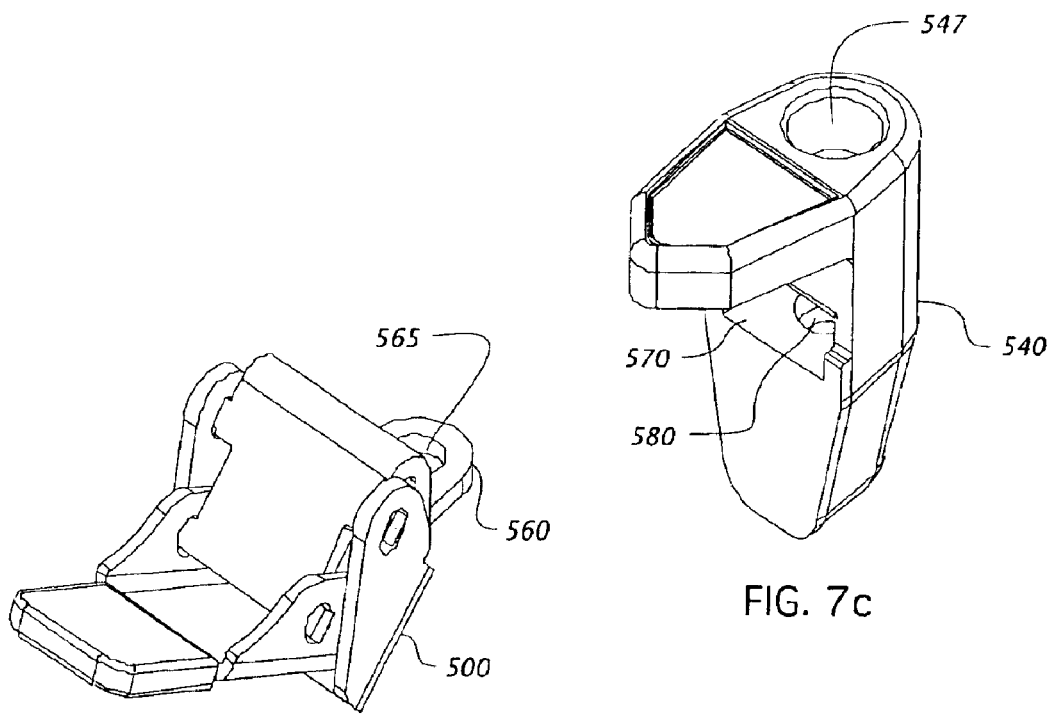
FIG. 7b
FIG. 7c

APPARATUS AND METHOD FOR SECURING A WATT-HOUR METER SOCKET BOX

BACKGROUND OF THE INVENTION

Electrical service providers generally deliver electricity to their customers via power lines buried underground or distributed along poles or towers overhead. The provider's power lines are usually distributed from a power generation station to numerous sets of customer lines, so that customers can then use the power to satisfy their various electrical needs. To measure delivered power so that customers can be billed in proportion to their usage, service providers typically terminate their power lines at a customer's home or business facility through a metered socket box, various designs for which are well known.

For example, one previously known meter box consists of two sets of electrical posts, with a provider's transmission lines being connected to one set of posts, and the customer's service lines to the other set. In order to measure the amount of electricity a customer uses, the meter box is configured to accept a watt-hour meter or another electricity usage measurement device, which, when plugged into the socket box, permits transmission of electricity from the provider to the customer and allows the amount of transmitted electricity to be accurately measured, so that the provider can charge the customer for power usage at an appropriate rate.

Various designs and uses for watt-hour meters are also well known, and all such designs and uses are incorporated into the teachings of the present invention. The present invention is also applicable in situations where the customer's service lines are routed from the meter box to a breaker box so that electricity can be distributed to multiple service locations using additional sets of electrical lines or wires.

Presently, there are two common types of meter socket boxes, each distinguished by the manner in which the meter is secured in place once it has been plugged into an electrical socket disposed in the meter box. For example, a ringed type meter box fitted with a flanged front cover is known, within which a watt-hour meter is disposed so that a head portion of the meter passes out through a flanged opening in the front cover. In this configuration, the meter is generally held in place using an annular, lockable sealing ring.

Also known is a ringless type meter box, in which the box cover secures the meter in place. For example, and referring now to prior art FIG. 1, a ringless type meter box 10 includes an installed meter 20 and a box cover 30, the meter box cover being shown prior to installation. Formed around an opening in a central portion of meter box cover 30 is a flange 40; a complementary flange 50 is disposed on meter 20 such that, when meter box cover 30 is installed over and around the head of meter 20, complementary flange sections 40 and 50 join together, so that the meter cannot be easily removed from the electrical socket unless the cover is first removed from the meter box.

The meter box cover 30 is typically secured in place by means of a small latch assembly, which functions in structural cooperation with a complementary latch-receiving member disposed on the meter box 10. The meter box cover 30 is used to secure the meter 20 to the electrical socket (not shown), so that completion of an electrical circuit is ensured, and the meter is reliably prevented from falling out of the meter box socket.

The meter box cover 30 also prevents unauthorized persons from tampering with the meter. For example, some customers have attempted to bypass the meter, so that unmeasured electricity could be used free of charge. Also, service providers are sometimes forced to disconnect service to customers, for example, due to non-payment of monthly bills. In this event, a locked meter box cover helps prevent a customer from entering the meter box and reconnecting electrical service. However, in instances where the small latch assembly on the meter box fails to provide sufficient security for preventing unauthorized access to the meter and meter box socket, a sturdier, more tamper resistant solution is required.

There are presently only a few commonly used security devices for securing meter box covers to socket boxes. One type requires an installer to drill or punch a hole in the meter box prior to installation of a fastening device. However, some installers are independent contractors rather than employees of the companies that own the meter boxes, and thus drilling or punching a starter hole in the box is sometimes undesirable. Also, drilling takes additional time and adds more steps to the installation, each of which could be avoided if drilling were not required.

To overcome these shortcomings, there are also locks that can be installed on ringless meter socket boxes that do not require drilling or punching a hole in the meter box. One such lock, for example, is the Inner-Tite Jiffy Lock™ or "IT Lock," shown in U.S. Pat. No. D463,248. The IT Lock essentially consists of a housing for the meter box lock assembly, and a grasping bracket having a clamp and thumb screw assembly for grasping the meter socket box.

During assembly, the bracket is hung over a wall of the meter box, sandwiching the wall between a portion of the bracket and the clamp. The clamp and bracket are then secured into place using a screw that is hand tightened, thereby fastening the base support assembly to the meter box. After the meter box door is installed, the housing member is secured to the support assembly using a plunger type lock. The meter box door is held in place by a lip disposed on a body portion of the housing.

However, the mentioned clamp and thumb screw assembly has proven dissatisfactory in practice because it is inherently limited by the installer's ability to reliably tighten the thumb screw tightly enough to secure the device to the meter box. This limitation can cause the entire support assembly to loosen, which can in turn allow the meter box cover to be easily removed or tampered with. Thus, a more secure apparatus and method is needed for quickly securing a cover to a meter box without requiring the drilling or punching of holes.

The McGard Intimidator Sidewinder-Lock™ is another example in the prior art of a security device that can be quickly attached to a meter box wall without using tools. The McGard™ locks essentially consist of a housing and a base support assembly, the support assembly consisting of a bracket, a swing arm, a clamp, and a spring plate. During assembly, the bracket is initially hung over a meter box wall with the swing arm and clamp in the open position. Even in this partially installed position, however, the meter box cover can still be closed without the swing arm and clamp being securely attached, and without the support base assembly being held firmly in place.

Thus, when the lid is placed over the meter box, there is no way of knowing whether the swing arm and clamp are fully secured. In fact, the simple act of placing a box cover over the meter box can, in certain circumstances, cause the swing arm to open accidentally, thereby releasing the tension in the spring plate and loosening the base support assembly from the wall without the installer's knowledge. If the support assembly loosens from the wall, the meter box door may still be opened, defeating the purpose of installing the lock.

There is, therefore, a need for a meter box security device that can be easily and quickly installed, which reliably ensures that the box cover cannot be shut once the support assembly is hung on a wall unless the clamping member is properly secured to a meter box wall. There is also a need for a meter box security apparatus that offers greater security for preventing unauthorized entry into a meter box than is known in the prior art. There is also a need for a meter box security device having a reduced number of parts, so as to limit system complexity and hold down manufacturing costs.

SUMMARY OF THE INVENTION

According to one embodiment of the invention, an apparatus for securing a box cover to a watt-hour meter socket box is provided, the apparatus comprising a clamping member having a clamp, a clamp actuating member, and a fastening shelf having a first securing means; and a lock housing having a second securing means.

According to a further embodiment of the invention, there is also provided a method for securing a box cover to a watt-hour meter socket box comprising disposing a clamping member having a clamp, a clamp actuating member, and a fastening shelf in proximity with a lock housing, and then locking the lock housing onto the clamping member using a fastening member.

BRIEF DESCRIPTION OF THE DRAWINGS

FIG. 3 shows a closed meter box with a box cover secured using a meter box security apparatus according to the present invention.

FIG. 4a shows a clamping member disposed over a sectional view of a wall portion of a meter box.

FIG. 4b is an isometric view of a clamping member according to the present invention.

FIG. 7a is a plan view of a clamping member and a lock housing, assembled so as to secure a meter box cover to a meter box.

FIG. 7b is an isometric view of a clamping member.

FIG. 7c is an isometric view of a lock housing.

DETAILED DESCRIPTION OF THE INVENTION

Figure 1:
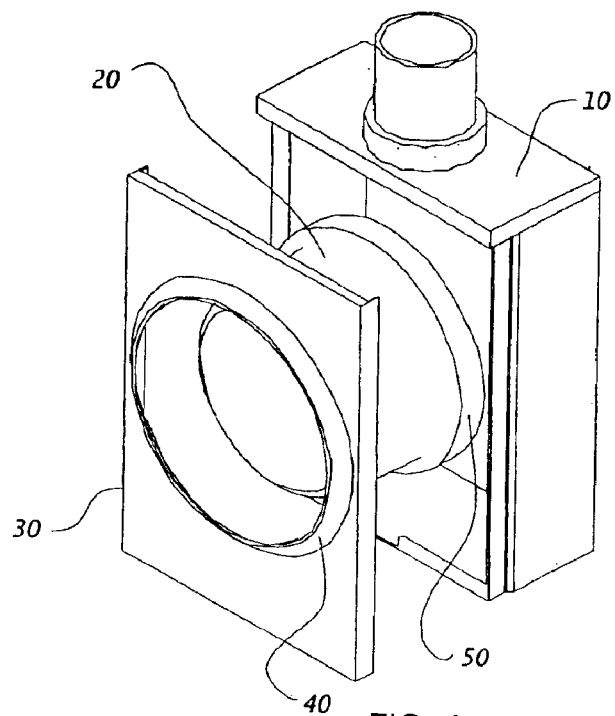
FIG. 1 is an exploded view of a known ringless meter socket box, including a watt-hour meter and a meter box lid.
Figure 2:
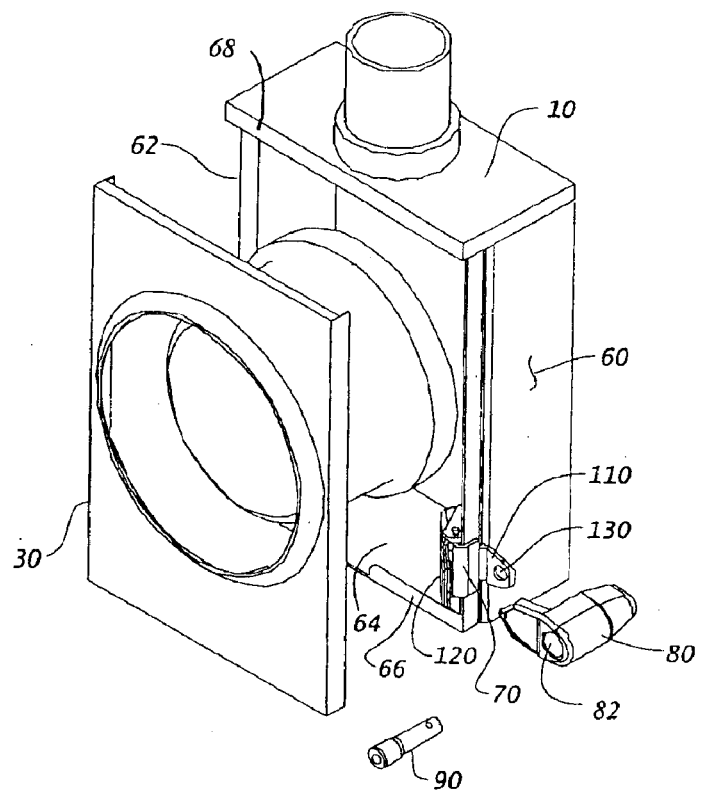
FIG. 2 is an exploded view of a meter box security apparatus comprising a clamping member and a plunger type lock housing.

Referring now to FIG. 2, an exploded view of an example embodiment of the invention is shown, comprising a clamping member 70 disposed over a wall portion 60 of a meter box 10. In FIG. 2, clamping member 70 is shown placed over the sidewall 140 in a non-secured position prior to installation. In other embodiments of the invention, clamping member 70 is disposed over an opposite wall portion 62 of meter box 10. In further example embodiments, clamping member 70 is disposed over a top wall portion 68 of meter box 10. In further example embodiments, clamping member 70 is disposed over a bottom wall portion 64 of meter box 10. In still further example embodiments, clamping member 70 is disposed over a retaining lip 66 disposed on a bottom wall portion 64 of meter box 10.

During installation, clamping member 70 is fastened into place using a clamp actuating member, for example, a fastening lever 120, example embodiments of which are described below. Once clamping member 70 is secured, meter box cover 30 is installed such that clamp actuating member 120 and one end of clamping member 70 are disposed entirely inside an enclosed portion of closed meter box 10, while a fastening shelf 110 remains disposed outside the meter box. In an alternative embodiment, fastening shelf 110 fits inside a slot or other opening in lock housing 80, and the meter box 10 and box cover 30 are fastened together by a plunger type fastener 90 inserted through both an aperture 82 formed in a body portion of lock housing 80 and an aperture 130 formed in a body portion of fastening shelf 110.

As seen in FIG. 3, according to a further example embodiment, a fully installed meter box security apparatus comprises a meter box 10 having a box cover 30 installed over the head of watt-hour meter 20, and a lock housing 80 fastened to a fastening shelf. Plunger type fastener 90 is inserted into an aperture formed in a body portion of lock housing 80 and then through an aperture formed in a body portion of the fastening shelf, thereby securing the lock housing 80 to the clamping member. Lock housing arm 100 in turn holds a meter box cover 30 securely in place so that the meter cannot be tampered with.

Referring now to FIG. 4a, an example embodiment of the invention is shown, comprising a clamping member 70 hung over a meter box wall portion 140. In a specific, non-limiting embodiment, clamping member 70 is a bracket, further comprising a fastening shelf 110 having an aperture 130 disposed at one end and a clamp actuating member 150 at the other end. A plurality of engagement members 180, 210 is disposed on a body portion of the clamping member 70. The particular location of and uses for the plurality of engagement members 180, 210 will vary according to the requirements of the operational environment.

For example, in certain embodiments, engagement member 210 further comprises a clamp 190 having a plurality of engagement surfaces 200, 215. In this particular embodiment, when clamp actuating member 150 is actuated toward a locked position, upper wall portion 140 is securely clamped between engagement surface 215 and clamping member 70 to achieve a reliable and secure installation. In other embodiments, engagement surface 200 also clamps beneath wall portion 140 to ensure a secure fitting. In a further embodiment, engagement surface 215 does not clamp to upper wall portion 140; in this configuration, only engagement surface 200 is secured beneath a portion of wall 140. An isometric view of some of the aforementioned features is shown in greater detail in FIG. 4b.

Referring again to FIG. 4a, when clamp actuating member 150 is rotated about actuable member 180, arced surface 170 contacts clamp 190, and through a cam-type action, sandwiches one (or both) of the clamp engagement surfaces 200, 215 between clamp actuating member 150 and wall portion 140, thereby creating a constant engagement surface along the interface between wall portion 140 and engagement surface 200. In another embodiment, the force applied to actuate clamp actuating member 150 into a fully engaged or secured position is translated and mechanically multiplied by the clamping force imparted by one (or both) of engagement surfaces 200, 215 onto wall portion 140. In certain alternative embodiments, engagement surface 200 includes one or more protruding tabs that grip wall portion 140 with greater force per unit area than would be realized by a constant engagement surface having a greater area.

Figure 5A:
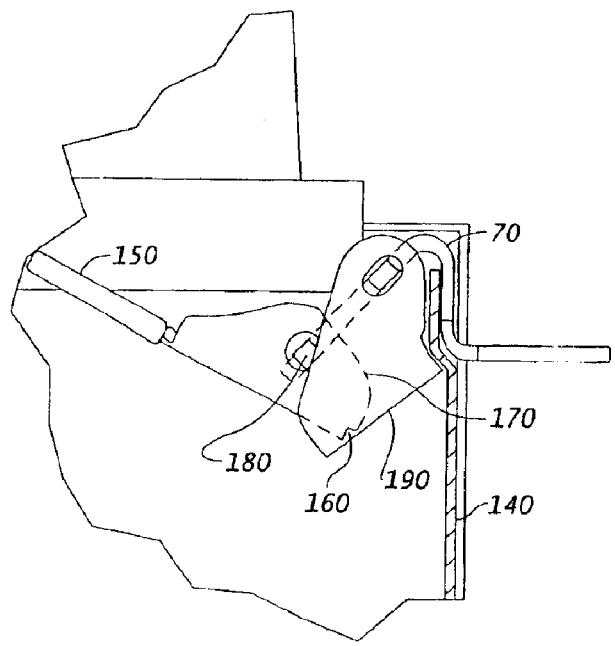
FIG. 5a shows a clamping member disposed in a fully clamped and secured position.

Referring now to the example embodiment of FIG. 5a, the position of clamp actuating member 150 is shown after it has been fully rotated into a secured position. In certain embodiments, clamp actuating member 150 is rotated until it securely fastens into a notched receiving member 160 cut out of arced surface member 170, the notched receiving member 160 providing a tactile indicator of when the clamp actuating member 150 has reached its fully secured position, and when clamping member 70 is securely fastened to a wall portion 140.

According to one embodiment of the invention, the specific location of notched receiving member 160 permits a terminus end of clamp actuating member 150, when fully rotated and secured, to be contained within an enclosed portion of the meter box even after the box cover has been fully installed. On the other hand, if clamp actuating member 150 is not fully rotated and secured into place, a terminus end of clamp actuating member 150 will protrude from the confines of the meter box, and will therefore not permit final installation of the box cover. In alternative embodiments, notched receiving member 160 is disposed so that the clamp actuating member 150, when fully rotated and secured in place, touches the inside surface of a fully installed box door, but does not interfere with its installation.

Figure 5B:
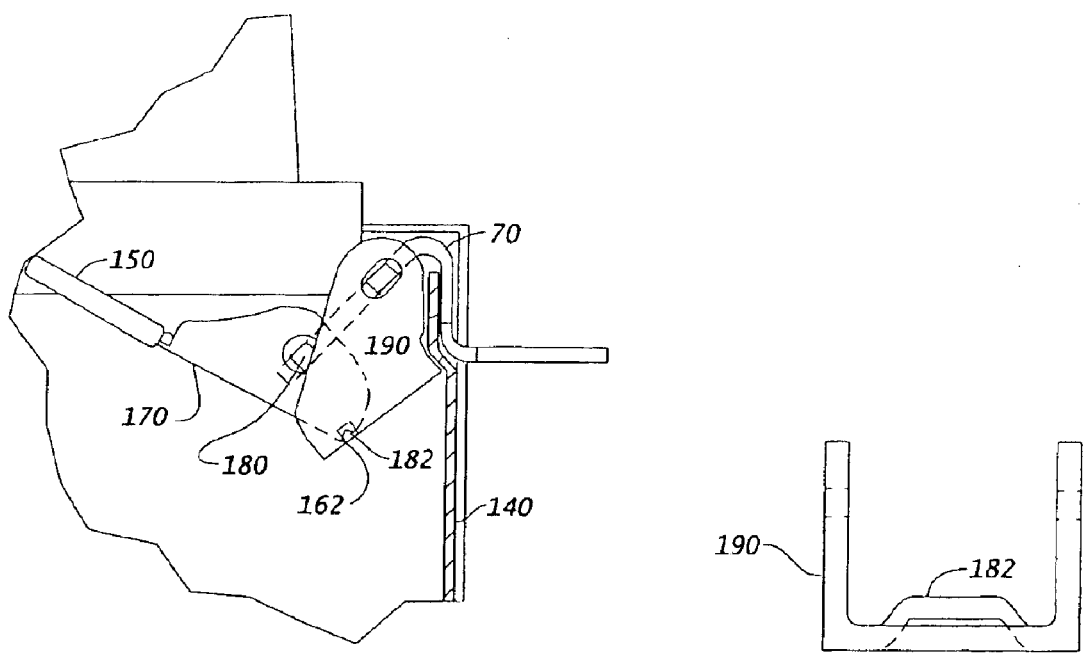
FIG. 5b shows a clamping member, further comprising a stopping member.
Figure 5C:
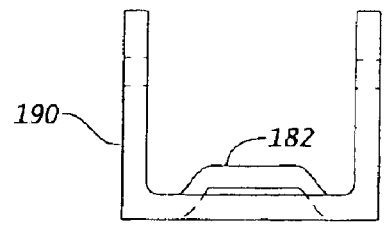
FIG. 5c is a front view of a stopping member disposed on a clamping member.

In other example embodiments, for example, as seen in FIG. 5b, a stopping member 182 is disposed along the bottom of clamp 190, upon which a bottom surface 162 of clamp actuating member 150 rests when the clamp actuating member 150 is in a fully secured position. In another example embodiment, stopping member 182 is disposed along the bottom of clamp 190 so as to prevent the fastening lever 150 from camming over a center of rotation. FIG. 5c shows a side view of another example embodiment of clamp 190, wherein stopping member 182 is stamped into or otherwise formed structurally integral with clamp 190. In other example embodiments, a stopping member 182 is affixed to the clamp 190 prior to installation.

In certain embodiments, clamp actuating member 150 is held in a fully secured position by both a frictional force imposed on notched receiving member 160 when the clamp actuating member 150 is fully turned, and by a spring force inherent in the interaction between the leverage on wall portion 140 imparted by clamp actuating member 150 and clamp 190. In other embodiments, clamp actuating member 150 is held in a fully secured position by means of a separate securing means, for example, by means of a latch or a spring (not shown) disposed between the clamp and the clamp actuating member.

Figure 6A:
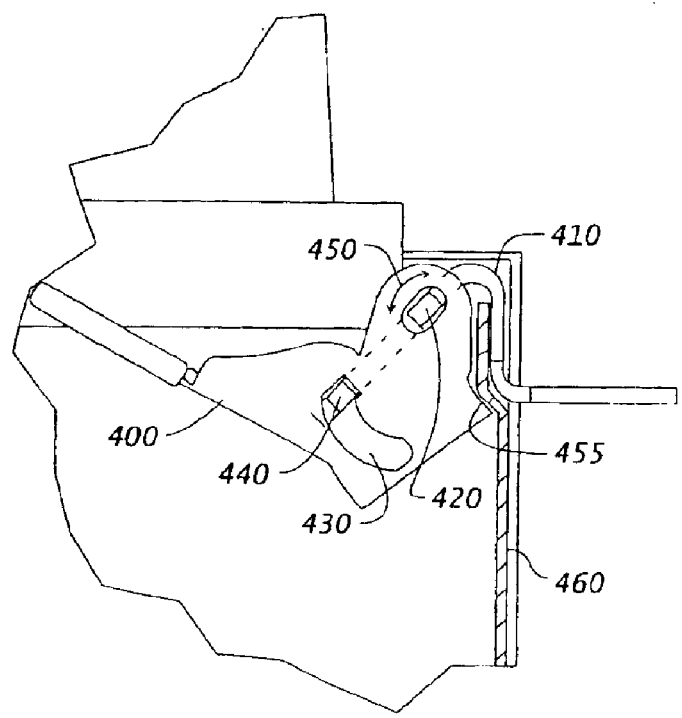
FIG. 6a shows a clamp actuating member according to the present invention.

Turning now to FIG. 6a, a further embodiment of the invention is shown, wherein a clamp actuating member 400 is attached to a clamping member 410, so that the clamp actuating member 400 rotates about a rotational axis established by the position of engagement means 420. A channel 430 is formed on at least one side of clamp actuating member 400, through which guide member 440 travels during actuation of clamp actuation member 400. During installation, clamp actuation member 400 is rotated about engagement member 420 so that bracket 410 will fit over a box wall 460. To secure the base to the wall, clamp actuating member 400 is then rotated in the other direction, back around engagement member 420, toward a secured position, so that surface engagement member 455 sandwiches wall portion 460 between bracket 410 and surface 455.

Figure 6B:
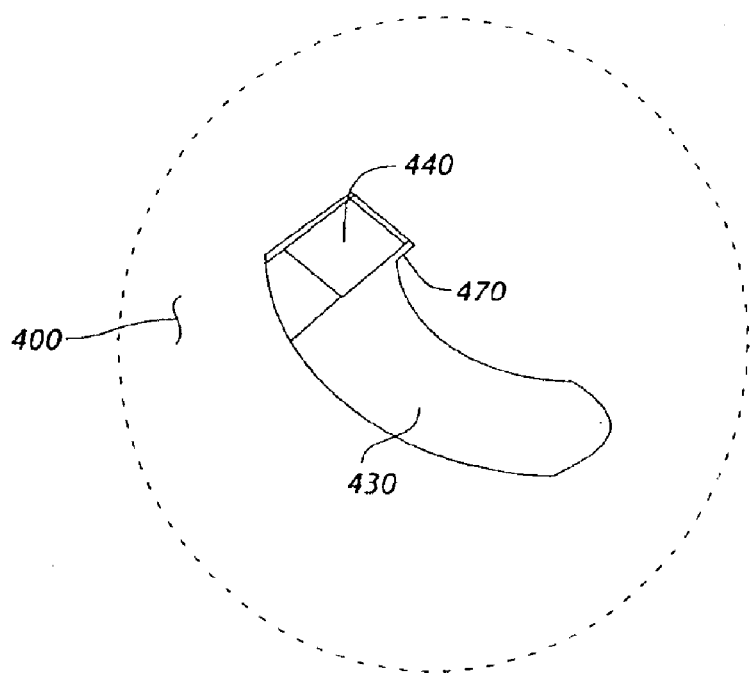
FIG. 6b is a close view of a latching mechanism suitable for use in connection with a clamp actuating member.

Referring now to FIG. 6b, a cut away view of clamp actuating member 400 is provided, wherein a channel 430 and a guide member 440 are shown as non-limiting aspects of the present invention. Clamp actuating member 400 is securely fastened in position after member rotation by means of a stopping shelf 470, upon which rests guide member 440, and also by the inherent spring forces present in the system after clamp actuating member 400 has been fully actuated into a secured position. According to one embodiment of the invention, the desired length and design of channel 430 and stopping shelf 470 is such that the clamp actuating member 400, when secured, is fully contained within an interior space present within the meter box, and does not interfere with installation of a box cover. In another example embodiment, the length and design of channel 430 and stopping shelf 470 are such that the clamp actuating member 400, when fully secured, touches an interior surface of a fully installed box cover, but, again, does not interfere with the cover's installation.

Referring now to FIG. 7a, another exemplary embodiment of the invention is shown, wherein the clamping member 500 is securely fastened to a wall portion 510, and box cover 520 is in a fully installed position. Lock housing 540 is affixed to meter box 530 by means of housing arm 545, and by the interaction between plunger type fastener 550 and fastening shelf 560, which has an aperture through which plunger type fastener 550 passes. In other embodiments, plunger type fastener 550 is held in place after installation by means of a retaining member 555. In various other embodiments, lock housing 540 and plunger type fastener 550 are replaced by a single unitary structure, which locks onto fastening shelf 560, thereby securing box cover 520 to meter box 530. In still other embodiments, housing arm 545 fits into a slot (not shown) formed in the box cover 520.

FIG. 7b and 7c are isometric views of further embodiments of the invention, wherein clamping member 500 and lock housing 540 are shown prior to installation. Fastening shelf 560 fits into a receiving shelf 570 such that aperture 547 lines up with aperture 565. To lock the two pieces together, a plunger type fastener is aligned with aperture 547, and then a body portion of the fastener is pushed through each of apertures 547, 565 and 580. Referring back to FIG. 7a, in some example embodiments of the invention, plunger type fastener 550 is secured in place inside the lock housing 540 by means of one or more retaining members 555. In still other embodiments, the plunger type fastener 550 is formed structurally integral with the lock housing 540.

The foregoing specification is provided for illustrative purposes only, and is not intended to describe all possible aspects of the present invention. Moreover, while the invention has been shown and described in detail with respect to several exemplary embodiments, those of ordinary skill in the art will appreciate that changes to the description, and various other modifications, omissions and additions may also be made without departing from either the spirit or scope thereof.

What is claimed is:

1. An apparatus for securing a box cover to a meter box, said apparatus comprising:
   a clamping member, wherein said clamping member further comprises a body portion, a clamp comprising a surrounding member which surrounds at least a part of said body portion wherein said surrounding member comprises at least one engagement surface, a clamp actuating member, and a fastening shelf having a first securing means; and
   a lock housing having a second securing means.

2. The apparatus of claim 1, wherein said clamp further comprises opposed, substantially parallel walls on which a pivoting member is disposed.

3. The apparatus of claim 2, wherein said clamp actuating member is captured between said opposed, substantially parallel walls of said clamp when said clamp actuating member is disposed in a fully secured position.

4. The apparatus of claim 1, wherein said first securing means further comprises a portion of said fastening shelf through which an aperture has been formed.

5. The apparatus of claim 1, wherein said second securing means comprises a portion of said lock housing through which an aperture has been formed.

6. The apparatus of either of claims 4 or 5, wherein each of said apertures is an approximately cylindrical aperture.

7. The apparatus of claim 1, further comprising a plunger type fastener.

8. The apparatus of claim 7, wherein said plunger type fastener further comprises a retaining member.

9. The apparatus of claim 1, wherein said clamp actuating member rotates about a rotational axis established by disposition of an engagement member on said body portion of said clamping member.

10. The apparatus of claim 9, wherein one end of said clamp actuating member receives an input force and rotates about an axis established by disposition of said engagement member disposed on said clamping member, and then translates a mechanical force to an opposite end of said clamp actuating member that is greater than the input force.

11. The apparatus of claim 1, wherein said clamp actuating member has a tactile feedback indicator for indicating when said clamp actuating member has been fully rotated into a secure position.

12. The apparatus of claim 1, wherein said clamp is disposed between said clamp actuating member and said fastening shelf.

13. The apparatus of claim 1, wherein said clamp further comprises a stopping member for stopping a rotational sweep of said clamp actuating member after said clamp actuating member is disposed in a fully secured position.

14. The apparatus of claim 1, wherein said clamp imparts a spring force that holds said clamp actuating member in a fully secured position.

15. A method for securing a box cover to a meter box, said method comprising:
   disposing a clamping member over a wall portion of said meter box, wherein said clamping member comprises a body portion, a clamp comprising a surrounding member which surrounds at least a part of said body portion wherein said surrounding member comprises at least one engagement surface, a clamp actuating member, and a fastening shelf having a first securing means;
   disposing a lock housing in functional cooperation with said clamping member, wherein said lock housing comprises a second securing means; and
   securing said clamping member using said lock housing.

16. The method of claim 15, further comprising disposing a fastening shelf so that said first securing means comprises a body portion of said fastening shelf through which an aperture has been formed.

17. The method of claim 16, further comprising disposing a lock housing so that said second securing means comprises said lock housing through which an aperture has been formed.

18. The method of claim 17, further comprising disposing a fastening shelf and said lock housing so that said first securing means and said second securing means comprise approximately cylindrical apertures.

19. The method of claim 15, further comprising disposing a plunger type fastener.

20. The method of claim 19, further comprising disposing a plunger type fastener, and then securing said plunger type fastener by means of a retaining member.

21. The method of claim 15, further comprising rotating said clamp actuating member about a rotational axis established by disposition of an engagement member disposed on said body portion of said clamping member.

22. The method of claim 21, further comprising:
   delivering an input force to one end of said clamp actuating member so that said clamp actuating member rotates about a rotational axis established by disposition of said engagement member on said clamping member; and translating said input force into a mechanical clamping force that is greater than the input force.

23. The method of claim 15, further comprising disposing a clamp actuating member having a tactile feedback indicator to indicate when said clamp actuating member has been fully rotated into a secure position.

24. The method of claim 15, further comprising disposing said clamp between said clamp actuating member and said fastening shelf.

25. The method of claim 24, further comprising disposing a clamp having a stopping member, wherein said stopping member stops a rotational sweep of said clamp actuating member after said clamp actuating member is disposed in a fully secured position.

26. The method of claim 24, further comprising disposing a clamp imparting a spring force that holds said clamp actuating member in a fully secured position.

* * * * *